(12) United States Patent
Cheng et al.

(10) Patent No.: US 12,035,586 B2
(45) Date of Patent: Jul. 9, 2024

(54) DISPLAY PANEL COMPRISING A POST SPACER, MANUFACTURING METHOD AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Hao Cheng, Beijing (CN); Yufei Ji, Beijing (CN); Liang Song, Beijing (CN); Pengyu Liao, Beijing (CN); Xin Li, Beijing (CN); Chuanyong Deng, Beijing (CN); Pan Hou, Beijing (CN); Honggang Gu, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 631 days.

(21) Appl. No.: 17/312,905

(22) PCT Filed: Dec. 30, 2020

(86) PCT No.: PCT/CN2020/141235
§ 371 (c)(1),
(2) Date: Jun. 10, 2021

(87) PCT Pub. No.: WO2021/136341
PCT Pub. Date: Jul. 8, 2021

(65) Prior Publication Data
US 2023/0363218 A1  Nov. 9, 2023

(30) Foreign Application Priority Data
Jan. 3, 2020 (CN) .................. 202010006906.X (51) Int. Cl.
*H10K 59/131* (2023.01)
*H10K 59/12* (2023.01)
(Continued)

(52) U.S. Cl.
CPC ....... *H10K 59/131* (2023.02); *H10K 59/1201* (2023.02); *H10K 59/873* (2023.02); *H10K 71/60* (2023.02)

(58) Field of Classification Search
CPC .................................................. H10K 59/131
(Continued)

(56) References Cited

U.S. PATENT DOCUMENTS

| 2017/0062550 A1 | 3/2017 | He et al. |
| 2021/0028249 A1 | 1/2021 | Ding et al. |

(Continued)

FOREIGN PATENT DOCUMENTS

| CN | 1329458 A | 1/2002 |
| CN | 109904208 A | 6/2019 |

(Continued)

OTHER PUBLICATIONS

PCT/CN2020/141235 International Search Report and Written Opinion.

*Primary Examiner* — Ajay Arora
(74) *Attorney, Agent, or Firm* — IPro, PLLC (57) ABSTRACT

The present disclosure provides a display panel, a manufacturing method thereof, and a display device. The display panel includes: a base substrate including a through hole penetrating through the base substrate, an encapsulation region of the base substrate including an edge surrounding the through hole; and a post spacer arranged between the edge of the encapsulation region surrounding the through hole and the through hole. The post spacer includes a first portion made of metal and a post body made of an insulating (Continued)

material, a distance between the first portion and the base substrate is greater than a distance between the post body and the base substrate, and an area of an orthogonal projection of the first portion onto the base substrate is greater than an area of an orthogonal projection of the post body onto the base substrate.

18 Claims, 4 Drawing Sheets

(51) Int. Cl.
*H10K 59/80* (2023.01)
*H10K 71/60* (2023.01)

(58) Field of Classification Search
USPC .......................................................... 257/40
See application file for complete search history.

(56) References Cited

U.S. PATENT DOCUMENTS

| | | | |
|---|---|---|---|
| 2021/0066657 A1* | 3/2021 | Chen | ................... H10K 50/844 |
| 2021/0159456 A1 | 5/2021 | Sun et al. | |
| 2021/0273194 A1 | 9/2021 | Xie et al. | |

FOREIGN PATENT DOCUMENTS

| | | | |
|---|---|---|---|
| CN | 110212113 A | 9/2019 | |
| CN | 110246984 A | 9/2019 | |
| CN | 110265583 A | 9/2019 | |
| CN | 110416282 A | 11/2019 | |
| CN | 111180465 A | 5/2020 | |

\* cited by examiner

DISPLAY PANEL COMPRISING A POST SPACER, MANUFACTURING METHOD AND DISPLAY DEVICE

CROSS-REFERENCE TO RELATED APPLICATION

The present application is the U.S. national phase of PCT Application No. PCT/CN2020/141235 filed on Dec. 30, 2020, which claims a priority of the Chinese patent application No.202010006906.X filed on Jan. 3, 2020, which is incorporated herein by reference in its entirety.

TECHNICAL FIELD

The present disclosure relates to the field of display technology, in particular to a display panel, a manufacturing method thereof, and a display device.

BACKGROUND

With the advancement of electronic technology, electronic devices such as mobile phones and notebook computers develop in the direction of pursuing a larger screen-to-body ratio. In order to increase the screen-to-body ratio of the electronic device, a display screen on which a camera needs to be provided adopts a structure in which a side frame but no an upper frame is provided at a position where the camera is located. If the camera is arranged in a hole in a display region of the display screen based on an organic light-emitting display principle, a through hole needs to be formed in the display region to receive a camera assembly, and then sealed with an encapsulation structure to prevent an organic light-emitting diode from being adversely affected when water and oxygen enter a sealed space via the through hole.

SUMMARY

An object of the present disclosure is to provide a display panel, a method for manufacturing the display panel, and a display device, so as to solve the above-mentioned problem.

In one aspect, the present disclosure provides in some embodiments a display panel, including: a base substrate including a through hole penetrating through the base substrate, an encapsulation region of the base substrate including an edge surrounding the through hole; and a post spacer arranged between the edge of the encapsulation region surrounding the through hole and the through hole. The post spacer includes a first portion made of metal and a post body made of an insulating material, a distance between the first portion and the base substrate is greater than a distance between the post body and the base substrate, and an area of an orthogonal projection of the first portion onto the base substrate is greater than an area of an orthogonal projection of the post body onto the base substrate.

In a possible embodiment of the present disclosure, the display panel further includes a first metal layer arranged on the base substrate and an insulating layer arranged between the first metal layer and the base substrate, the first metal layer and the first portion are arranged on a same layer and made of a same metal material, and the insulating layer and the post body are arranged on a same layer and made of the insulating material.

In a possible embodiment of the present disclosure, the display panel further includes a second metal layer arranged between the insulating layer and the base substrate and between the post body and the base substrate.

In a possible embodiment of the present disclosure, the second metal layer is a gate metal layer and the first metal layer is a source/drain metal layer.

In a possible embodiment of the present disclosure, the insulating layer further includes a gate dielectric sublayer arranged at a side of the first metal layer adjacent to the base substrate, and an interlayer dielectric sublayer arranged at a side of the gate dielectric sublayer away from the first metal layer. The post body further includes a gate dielectric sublayer arranged at a side of the first portion adjacent to the base substrate, and an interlayer dielectric sublayer arranged at a side of the gate dielectric sublayer away from the first portion.

In a possible embodiment of the present disclosure, the display panel further includes a light-emitting layer arranged at a region between the edge of the encapsulation region surrounding the through hole and the through hole, covering the first portion of the post spacer and the second metal layer, and interrupted at a position corresponding to the post body of the post spacer.

In a possible embodiment of the present disclosure, an orthogonal projection of the post spacer onto the base substrate is of an annular structure.

In a possible embodiment of the present disclosure, the post body is in direct contact with the second metal layer.

In a possible embodiment of the present disclosure, the post body is in direct contact with the base substrate.

In a possible embodiment of the present disclosure, the display panel further includes a buffer layer arranged between the second metal layer and the base substrate.

In another aspect, the present disclosure provides in some embodiments a display device including the above-mentioned display panel, an organic light-emitting diode arranged at a display region of the display panel, and an encapsulation structure for encapsulating the organic light-emitting diode.

In a possible embodiment of the present disclosure, the encapsulation structure includes an inorganic encapsulation layer covering at least the first portion of the post spacer, the post body, and a portion of the second metal layer.

In yet another aspect, the present disclosure provides in some embodiments a method for manufacturing the above-mentioned display panel, including: providing the base substrate and forming a through hole penetrating through the base substrate; forming the first metal layer and the insulating layer on the base substrate; and etching the first metal layer and the insulating layer, and forming the post spacer at a region between the edge of the encapsulation region surrounding the through hole and the through hole. The post spacer includes the first portion made of metal and the post body made of an insulating material, a distance between the first portion and the base substrate is greater than a distance between the post body and the base substrate, and an area of an orthogonal projection of the first portion onto the base substrate is greater than an area of an orthogonal projection of the post body onto the base substrate.

In a possible embodiment of the present disclosure, the forming the post spacer at the region between the edge of the encapsulation region surrounding the through hole and the through hole includes: subsequent to forming the first metal layer and the insulating layer, treating the first metal layer and the insulating layer at the region between the edge of the encapsulation region and the through hole through a first patterning process to form a post spacer preform having a same width as a portion of the first metal layer and a portion of the insulating layer; forming a mask at a region where the post spacer preform is located, the mask covering a region other than the post spacer preform; and treating the post spacer preform through a second patterning process to form the post spacer. A reaction rate of an etchant used in the second patterning process with the insulating layer is greater than a reaction rate of the etchant with the first metal layer.

In a possible embodiment of the present disclosure, the method further includes: forming the second metal layer on the base substrate prior to forming the first metal layer and the insulating layer, the post spacer preform and the second metal layer around the post spacer preform being exposed through the mask; and treating the post spacer preform through the second patterning process to form the post spacer. A reaction rate of an etchant used in the second patterning process with the insulating layer is greater than a reaction rate of the etchant with the first metal layer.

In a possible embodiment of the present disclosure, the etchant contains hydrogen fluoride (HF) in a mass content of 1% to 2%.

In a possible embodiment of the present disclosure, subsequent to forming the post spacer, the method further includes: forming the light-emitting layer. The light-emitting layer covers the first portion of the post spacer and a portion of the second metal layer around the post spacer, and portions of the light-emitting layer covering the first portion of the post spacer and covering the portion of the second metal layer are interrupted at a position corresponding the post body of the post spacer.

BRIEF DESCRIPTION OF THE DRAWINGS

In order to illustrate the technical solutions in the present disclosure or the related art in a clearer manner, the drawings desired for the present disclosure or the related art will be described hereinafter briefly.

REFERENCE SIGN LIST 100 base substrate
20 buffer layer
10 through hole
30 mask
40 post spacer
110 display region
200A edge encapsulation boundary
200B through-hole encapsulation boundary
200 dam-like structure
300 insulating layer
310 interlayer dielectric sublayer
320 gate dielectric sublayer
400 first metal layer
500 second metal layer
600 light-emitting layer
210 inorganic encapsulation layer

DETAILED DESCRIPTION

The present disclosure will be described hereinafter in conjunction with the embodiments and the drawings. Identical or similar reference numbers in the drawings represent an identical or similar element or elements having an identical or similar function. The following embodiments are for illustrative purposes only, but shall not be used to limit the scope of the present disclosure.

Figure 1:
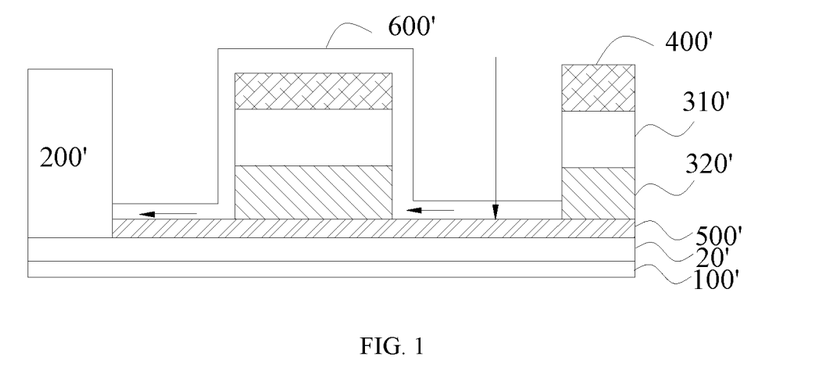
FIG. 1 is a schematic view showing a conventional display panel.

FIG. 1 is a schematic view showing a conventional display panel. Referring to FIG. 1, for a back plate with a through hole (AA hole) at a display region, an encapsulation structure is arranged in such a manner as to surround the through hole to encapsulate an organic light-emitting diode. After the formation of the through hole, a metal layer and an insulating layer, such as a first metal layer 400', an interlayer dielectric sublayer 310', and a gate dielectric sublayer 320', remain at a position (a portion shown in FIG. 1) between the through hole and a dam-like structure 200' which is located around a boundary of a through-hole encapsulation region. If each of these layers has a structure with an equal width from top to bottom, a light-emitting layer 600' may be a continuous film layer on the metal layer and the insulating layer. When a portion outside an encapsulation region for the organic light-emitting diode, especially the remaining light-emitting layer at the position, is a continuous film layer, the light-emitting layer may easily be oxidized due to water absorbed by a light-emitting layer material. Water and oxygen may enter the display region along the continuous light-emitting layer 600' and across the dam-like structure 200' in a direction indicated by an arrow in FIG. 1, so the encapsulation may fail, and a service life of the back plate may be shortened.

An object of the present disclosure is to provide a back plate with a more appropriate structure, so as to improve the resistance to water and oxygen at the through hole in the display region.

Figure 2:
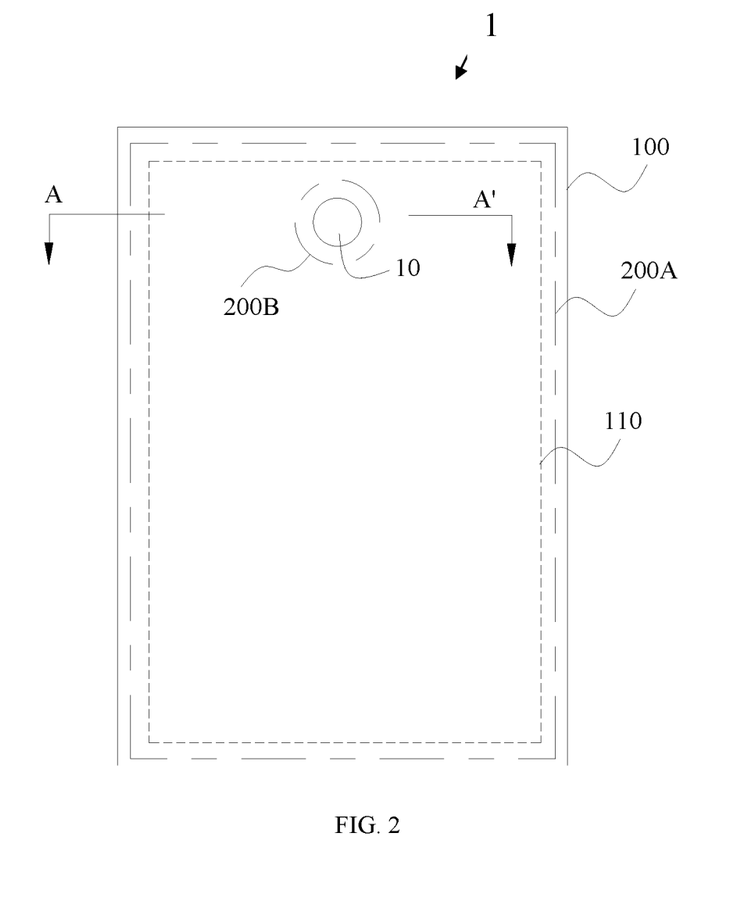
FIG. 2 is a partially schematic view showing a display panel according to one embodiment of the present disclosure.
Figure 3:
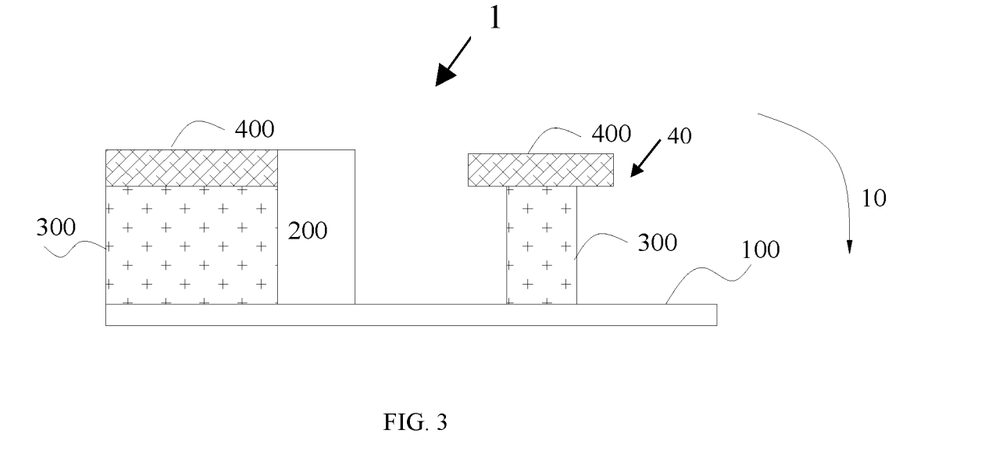
FIG. 3 is a schematic view showing a display panel according to one embodiment of the present disclosure.

As shown in FIG. 2 and FIG. 3, the present disclosure provides in some embodiments a display panel, and FIG. 3 is a sectional view of the display panel along line A-A' in FIG. 2. As mentioned hereinabove, in order to improve the screen-to-body ratio, it is necessary to form a through hole 10 at a display region 110 of a back plate to accommodate a camera assembly. Hence, apart from an edge encapsulation boundary 200A, the back plate needs to be provided with an encapsulation structure surrounding the through hole, i.e., the back plate needs to be provided with a through-hole encapsulation boundary 200B. It should be appreciated that, when forming such components as thin film transistors, a material layer (e.g., a metal layer, an inorganic layer or a semiconductor layer) is formed at first, and then the layer is etched through a patterning process to acquire the thin film transistors or metal lines. At this time, parts of the metal layer and an insulating layer may remain at a region between the through-hole encapsulation boundary 200B and the through hole 10. Referring to FIG. 2 and FIG. 3, the display panel includes a back plate 1 which includes the through hole 10 penetrating through the back plate 1 (e.g. in the display region 110), and an encapsulation region is provided with an edge surrounding the through hole 10, i.e. the through hole encapsulation boundary 200B. The back plate 1 includes a base substrate 100, and a first metal layer 400 and an insulating layer 300 arranged on the base substrate 100. The first metal layer 400 and the insulating layer 300 extend from the display region 110 to a position outside the encapsulation region and close to the through hole 10. A post spacer 40 is arranged between the through-hole encapsulation boundary 200B and the through hole 10, and includes a top portion formed by a part of the first metal layer 400 and a post body formed by a part of the insulating layer 300. An area of an orthogonal projection of the top portion onto the base substrate 100 is greater than an area of an orthogonal projection of the post body onto the base substrate 100. For example, in a cross section perpendicular to the base substrate 100 (as shown in FIG. 3), a size of the top portion of the post body 40 is greater than a size of the post body. In other words, the post spacer 40 is of a structure with a wider top portion and a narrower post body. During the formation of a light-emitting layer, the light-emitting layer may be interrupted at a position between the post body and the top portion, so as to prevent water and oxygen from passing through the remaining light-emitting layer surrounding the through hole and entering the encapsulation region, and improve the resistance to water and oxygen at a position where the through hole 10 is located, thereby to improve a service life of the display panel.

In the back plate 1 according to the embodiments of the present disclosure, due to the post spacer 40 with the wider top portion and the narrower post body in FIG. 3, the light-emitting layer may not be a continuous film layer covering the top portion and the post body of the post spacer, and the remaining light-emitting layer outside the encapsulation region may be separated from the light-emitting layer at the encapsulation region, so it is able to remarkably improve the resistance to water and oxygen for the display panel.

It should be appreciated that, when forming such components as thin film transistors, a material layer (e.g., a metal layer, an inorganic layer or a semiconductor layer) is formed at first, and then the layer is etched through a patterning process to acquire the thin film transistors or metal lines. At this time, parts of the metal layer and an insulating layer may remain at the region between the through-hole encapsulation boundary 200B and the through hole 10. Similarly, after the formation of the light-emitting layer on the back plate 1, there may also exist the remaining light-emitting layer at this position. In the embodiments of the present disclosure, the post spacer 40 may be made of a residual material after forming the thin film transistors. In other words, the post spacer 40 may be formed by using the residual material after forming source/drain electrodes of the thin film transistor, a gate insulating layer or an interlayer insulating layer.

Figure 4:
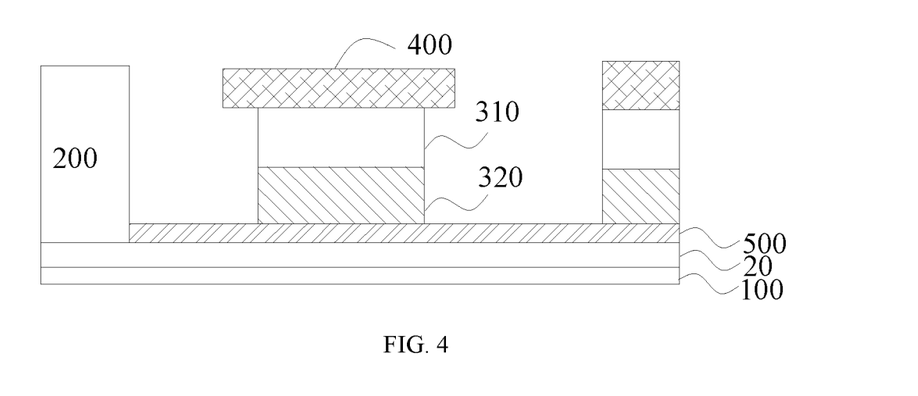
FIG. 4 is another schematic view showing the display panel according to one embodiment of the present disclosure.

FIG. 4 is a schematic view showing the display panel according to one embodiment of the present disclosure. Referring to FIG. 4, the back plate 1 may further include a second metal layer 500 arranged between the insulating layer 300 and the base substrate 100. Specifically, the second metal layer 500 may be a gate metal layer and the first metal layer 400 may be a source/drain metal layer. The insulating layer 300 may further include a gate dielectric sublayer 320 and an interlayer dielectric sublayer 310. Hence, the post spacer may be formed by using the insulating layer and the metal layer in the back plate. In general, the top portion of the post spacer may be made of metal and the post body may be made of an inorganic material such as a commonly-used insulating material for forming the thin film transistor, e.g., silicon nitride or silicon dioxide. The specific materials of the first metal layer 400 and the second metal layer 500 will not be particularly defined herein, and any commonly-used metal or alloy may be selected. For example, the second metal layer 500 may be used to form a gate electrode of the thin film transistor, and it may be made of a metal material including, but not limited to, Mo. Due to a difference between the metal material and the inorganic material, the post spacer may be formed by etching the layers with an etchant which does not react with the metal material but reacts with the inorganic material, or which reacts more slowly with the metal material and more rapidly with the inorganic material, so as to conveniently acquire the structure with the top portion and the post body at different sizes. In other words, a segment difference may be provided for the post body of the post spacer to prevent the formation of the continuous light-emitting layer. In order to further improve the segment difference of the post body, a bottom portion of the post body (at a side facing the base substrate 100) may be formed on another metal layer, i.e., the second metal layer 500, so as to provide an H-shaped post spacer.

Figure 5:
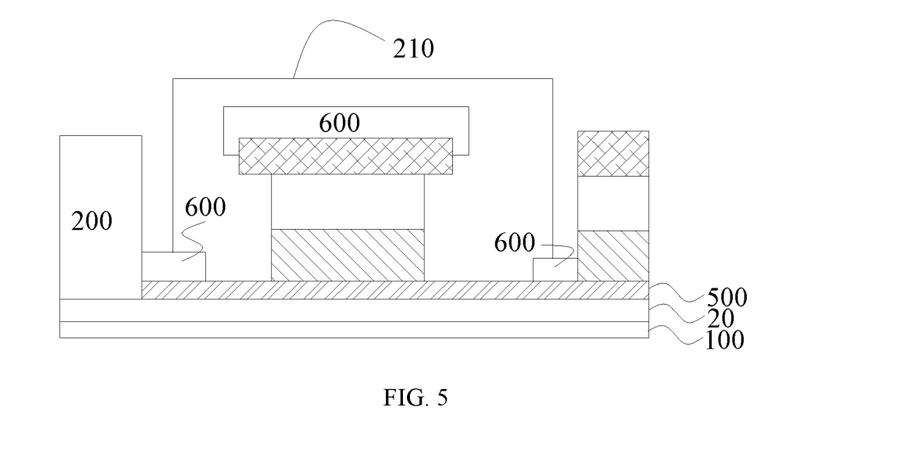
FIG. 5 is yet another schematic view showing the display panel according to one embodiment of the present disclosure.

Referring to FIG. 5, during the formation of the light-emitting layer 600, due to the H-shaped post spacer 20, the light-emitting layer 600 merely covers the top portion of the post spacer 20 and a portion of the second metal layer 500, and it may be interrupted at the position corresponding to the post body of the post spacer 40, so as to further improve the resistance to water and oxygen at the position corresponding to the post spacer. Especially, when forming the encapsulation structure, the light-emitting layer 600 covering the top portion of the post spacer may be covered by a deposited inorganic encapsulation layer 210. Even if a part of the light-emitting layer 600 is exposed due to the constraint of process accuracy, the structure inside the encapsulation region may not be adversely affected because the exposed light-emitting layer is not a continuous film layer.

In the embodiments of the present disclosure, the base substrate 100 may be a flexible substrate. It should be appreciated that, such structures as a buffer layer 20 may also be arranged between the base substrate 100 and the structure for forming the thin film transistor, e.g., the second metal layer 500. In other words, the back plate in the embodiments of the present disclosure may be a rigid or flexible back plate.

The present disclosure further provides in some embodiments a display device including the above-mentioned display panel and an organic light-emitting diode arranged on the back plate of the display panel. The encapsulation structure is used to encapsulate the organic light-emitting diode. Hence, the display device has all the above-mentioned features and advantages of the back plate of the display panel, which will thus not be particularly defined herein. In general, the display device has at least one of such advantages as a relatively large screen-to-body ratio and a long service life.

In the embodiments of the present disclosure, the encapsulation structure may include an inorganic encapsulation layer. A part of the inorganic encapsulation layer outside the encapsulation region may at least cover the top portion and the post body of the post spacer, i.e., the display device may have a structure in the region between the dam-like structure 200 and the through hole as shown in FIG. 5.

Figure 6:
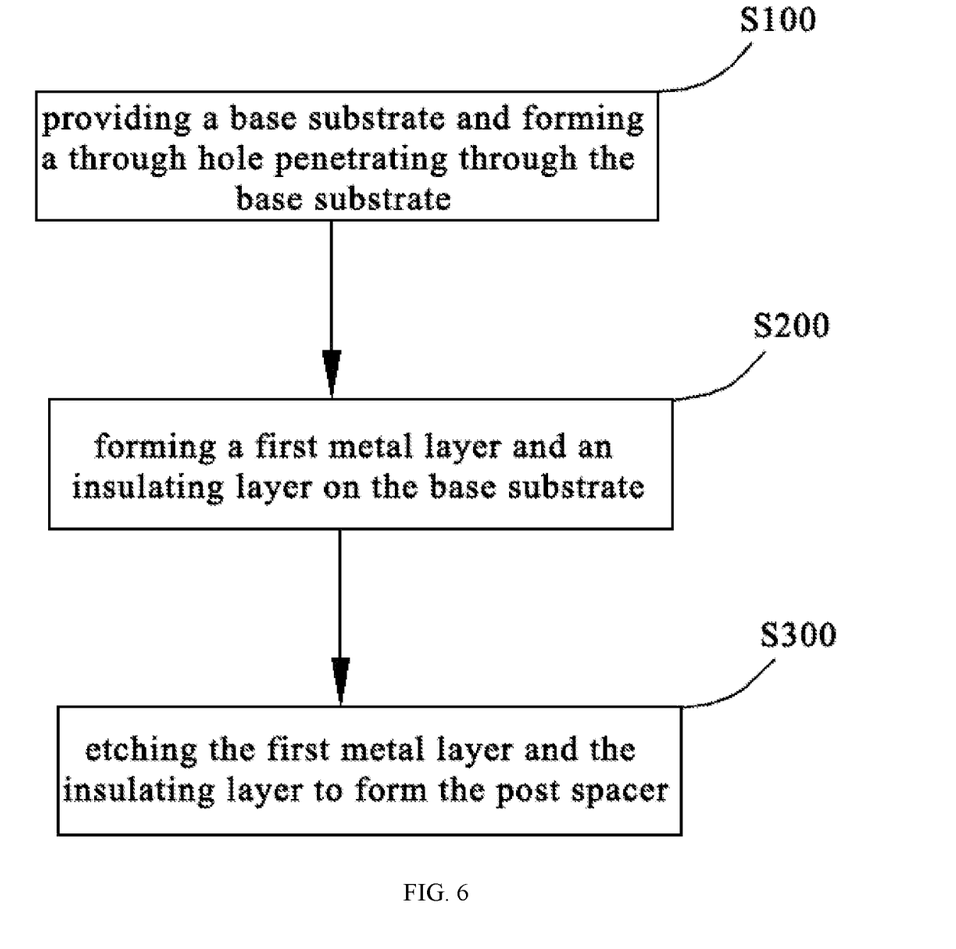
FIG. 6 is a flow chart of a method for manufacturing the display panel according to one embodiment of the present disclosure.

The present disclosure further provides in some embodiments a method for manufacturing the above-mentioned display panel. Referring to FIG. 6, the method includes the following steps.

S100: providing the base substrate and forming a through hole penetrating through the base substrate.

In the embodiments of the present disclosure, the base substrate may be provided, and the through hole penetrating through the base substrate may be formed in the display region of the base substrate.

S200: forming the first metal layer and the insulating layer on the base substrate.

In the embodiments of the present disclosure, such structures for forming the thin film transistor as the insulating layer and the first metal layer may be formed on the base substrate.

Specifically, this step may include etching the insulating layer and the first metal layer at the display region to form the thin film transistor. In some embodiments of the present disclosure, this step may specifically include forming the first metal layer, the gate dielectric sublayer, the interlayer dielectric sublayer and the second metal layer. The first metal layer may be a source/drain metal layer, and the second metal layer may be a gate metal layer.

S300: etching the first metal layer and the insulating layer to form the post spacer.

In the embodiments of the present disclosure, in this step, the first metal layer and the insulating layer may be etched so as to form the post spacer outside the encapsulation region and at a region between the edge surrounding the through hole and the through hole. The position and shape of the post spacer have been described in details hereinabove and will thus not be particularly defined herein. Specifically, in a cross section perpendicular to the base substrate, a length of the top portion of the post spacer may be greater than a length of the post body of the post spacer.

In the embodiments of the present disclosure, the post spacer may be formed as follows.

Figure 7:
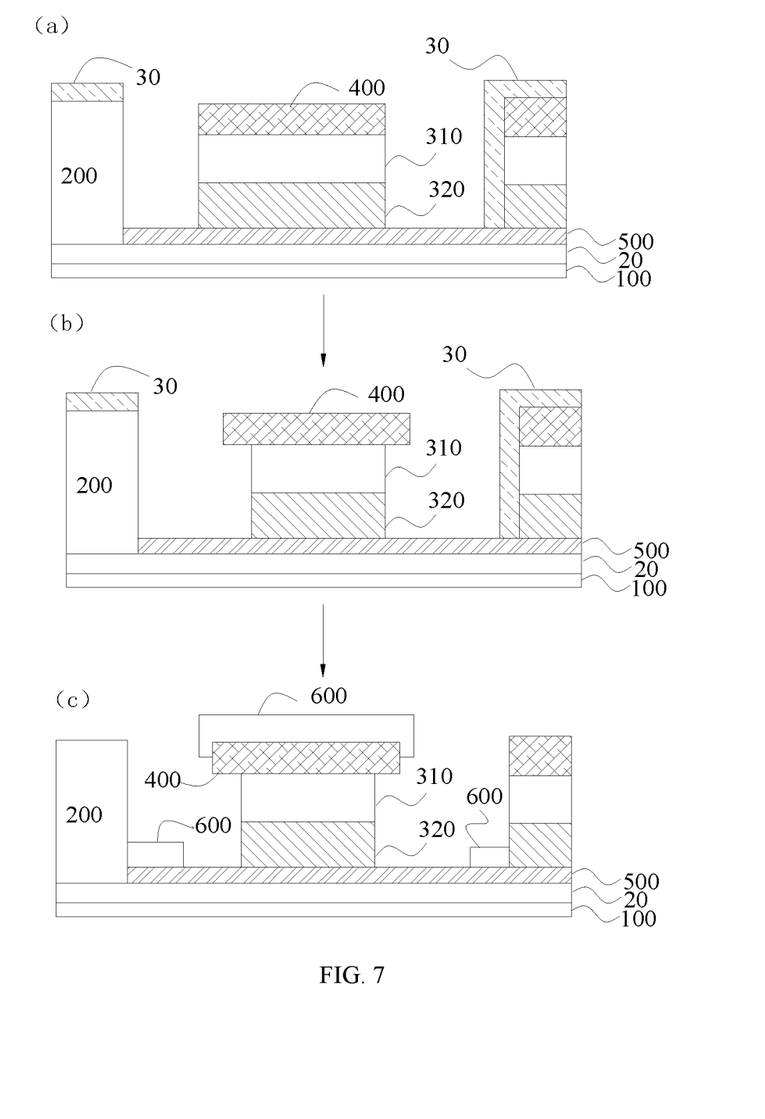
FIG. 7 is another flow chart of the method for manufacturing the display panel according to one embodiment of the present disclosure.

Referring to FIG. 7(a), after the formation of the first metal layer 400, the layers at the region between the edge of the encapsulation region and the through hole may be treated through a first patterning process to form a post spacer preform whose top portion and post body have a same width. Next, a mask 30 may be formed at a region where the post spacer preform is located, and the top portion of the post spacer preform and a portion of the second metal layer 500 surrounding the post spacer preform may be exposed through the mask 30. Then, the post spacer preform may be treated through a second patterning process. A reaction rate of an etchant used in the second patterning process with the insulating layer may be greater than a reaction rate of the etchant with the first metal layer and the second metal layer. In other words, in the second patterning process, the reaction rate of the etchant with the insulating layer between the first metal layer and the second metal layer (e.g., the gate dielectric sublayer 320 and the interlayer dielectric sublayer 310 in FIG. 7(a)) is relatively large, so the insulating layer may be etched at a rate greater than the first metal layer 400 and the second metal layer 500. Hence, a size of the insulating layer may be reduced remarkably when the first metal layer 400 and the second metal layer 500 are not etched obviously, so as to conveniently form the post spacer with the wider top portion and the narrower post body. To be specific, the etchant may be a known reagent which reacts with the insulating layer, e.g., a nitride or an oxide, more rapidly, and which reacts with metal more slowly. After the formation of the mask 30, the etchant may contact parts of the first metal layer, the insulating layer and the second metal layer exposed to the outside. At this time, due to different reaction rates, a larger portion of the insulating layer may be etched off, and the metal layers may be etched slowly, so as to acquire the structure as shown in FIG. 7(b).

In the embodiments of the present disclosure, the etchant may contain hydrogen fluoride (HF) in a mass content of 1% to 2%, e.g., 1.5±0.1%. Hence, the above-mentioned post spacer with the wider top portion and the narrower post body may be formed conveniently. After the formation of the post spacer, the mask 30 may be removed for the subsequent process, e.g., forming the light-emitting layer 600. As mentioned hereinabove, due to the segment difference for the post body of the post spacer, the light-emitting layer may have a structure as shown in FIG. 7(c) at the position corresponding to the post spacer. In this way, it is able to form a discontinuous light-emitting layer 600 around the bam-like structure 200, thereby to improve the resistance to water and oxygen for the back plate.

In the embodiments of the present disclosure, such words as "on" and "under" are used to indicate directions or positions as viewed in the drawings, and they are merely used to facilitate the description in the present disclosure, rather than to indicate or imply that a device or member must be arranged or operated at a specific position.

In the above description, such expressions as "one embodiment" and "the other embodiment" intend to indicate that the features, structures or materials are contained in at least one embodiment or example of the present disclosure, rather than referring to an identical embodiment or example. In addition, the features, structures or materials may be combined in any embodiment or embodiments in an appropriate manner. In the case of no conflict, the embodiments or examples or the features therein may be combined in any form. ○ In addition, it should be appreciated that, such words as "first" and "second" are merely used to differentiate different components rather than to represent any order, number or importance.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display panel, comprising:
    a base substrate comprising a through hole penetrating through the base substrate, an encapsulation region of the base substrate comprising an edge surrounding the through hole; and
    a post spacer arranged between the edge of the encapsulation region surrounding the through hole and the through hole,
    wherein the post spacer comprises a first portion made of metal and a post body made of an insulating material, a distance between the first portion and the base substrate is greater than a distance between the post body and the base substrate, and an area of an orthogonal projection of the first portion onto the base substrate is greater than an area of an orthogonal projection of the post body onto the base substrate;
    a first metal layer arranged on the base substrate and an insulating layer arranged between the first metal layer and the base substrate, wherein the first metal layer and the first portion are arranged on a same layer and made of a same metal material, and the insulating layer and the post body are arranged on a same layer and made of the insulating material.

2. The display panel according to claim 1, further comprising a second metal layer arranged between the insulating layer and the base substrate and between the post body and the base substrate.

3. The display panel according to claim 2, wherein the second metal layer is a gate metal layer and the first metal layer is a source/drain metal layer.

4. The display panel according to claim 2, wherein the insulating layer further comprises a gate dielectric sublayer arranged at a side of the first metal layer adjacent to the base substrate, and an interlayer dielectric sublayer arranged at a side of the gate dielectric sublayer away from the first metal layer, and wherein the post body further comprises a gate dielectric sublayer arranged at a side of the first portion adjacent to the base substrate, and an interlayer dielectric sublayer arranged at a side of the gate dielectric sublayer away from the first portion.

5. The display panel according to claim 2, further comprising a light-emitting layer arranged at a region between the edge of the encapsulation region surrounding the through hole and the through hole, covering the first portion of the post spacer and the second metal layer, and interrupted at a position corresponding to the post body of the post spacer.

6. The display panel according to claim 2, wherein an orthogonal projection of the post spacer onto the base substrate is of an annular structure.

7. The display panel according to claim 2, wherein the post body is in direct contact with the second metal layer.

8. The display panel according to claim 1, wherein the post body is in direct contact with the base substrate.

9. The display panel according to claim 2, further comprising a buffer layer arranged between the second metal layer and the base substrate.

10. A display device, comprising the display panel according to claim 1, an organic light-emitting diode arranged at a display region of the display panel, and an encapsulation structure for encapsulating the organic light-emitting diode.

11. The display device according to claim 10, wherein the encapsulation structure comprises an inorganic encapsulation layer covering at least the first portion of the post spacer, the post body, and a portion of the second metal layer.

12. A method for manufacturing the display panel according to claim 1, comprising providing the base substrate and forming a through hole penetrating through the base substrate; forming the first metal layer and the insulating layer on the base substrate; and etching the first metal layer and the insulating layer, and forming the post spacer at a region between the edge of the encapsulation region surrounding the through hole and the through hole, wherein the post spacer comprises the first portion made of metal and the post body made of an insulating material, a distance between the first portion and the base substrate is greater than a distance between the post body and the base substrate, and an area of an orthogonal projection of the first portion onto the base substrate is greater than an area of an orthogonal projection of the post body onto the base substrate.

13. The method according to claim 12, wherein the forming the post spacer at the region between the edge of the encapsulation region surrounding the through hole and the through hole comprises: subsequent to forming the first metal layer and the insulating layer, treating the first metal layer and the insulating layer at the region between the edge of the encapsulation region and the through hole through a first patterning process to form a post spacer preform having a same width as a portion of the first metal layer and a portion of the insulating layer; forming a mask at a region where the post spacer preform is located, the mask covering a region other than the post spacer preform; and treating the post spacer preform through a second patterning process to form the post spacer, wherein a reaction rate of an etchant used in the second patterning process with the insulating layer is greater than a reaction rate of the etchant with the first metal layer.

14. The method according to claim 12, further comprising: forming the second metal layer on the base substrate prior to forming the first metal layer and the insulating layer, the post spacer preform and the second metal layer around the post spacer preform being exposed through the mask; and treating the post spacer preform through the second patterning process to form the post spacer, wherein a reaction rate of an etchant used in the second patterning process with the insulating layer is greater than a reaction rate of the etchant with the first metal layer.

15. The method according to claim 13, wherein the etchant contains hydrogen fluoride (HF) in a mass content of 1% to 2%.

16. The method according to claim 13, wherein subsequent to forming the post spacer, the method further comprises forming the light-emitting layer, wherein the light-emitting layer covers the first portion of the post spacer and a portion of the second metal layer around the post spacer, and portions of the light-emitting layer covering the first portion of the post spacer and covering the portion of the second metal layer are interrupted at a position corresponding the post body of the post spacer.

17. The display panel according to claim 3, wherein the insulating layer further comprises a gate dielectric sublayer arranged at a side of the first metal layer adjacent to the base substrate, and an interlayer dielectric sublayer arranged at a side of the gate dielectric sublayer away from the first metal layer, and wherein the post body further comprises a gate dielectric sublayer arranged at a side of the first portion adjacent to the base substrate, and an interlayer dielectric sublayer arranged at a side of the gate dielectric sublayer away from the first portion.

18. The display panel according to claim 3, further comprising a light-emitting layer arranged at a region between the edge of the encapsulation region surrounding the through hole and the through hole, covering the first portion of the post spacer and the second metal layer, and interrupted at a position corresponding to the post body of the post spacer.

* * * * *